(12) United States Patent
Renz

(10) Patent No.: US 6,306,189 B1
(45) Date of Patent: Oct. 23, 2001

(54) CLEAN ROOM

(75) Inventor: Manfred Renz, Ditzingen (DE)

(73) Assignee: M+W Zander Facility Engineering GmbH & Co. KG (DE)

( * ) Notice: Subject to any disclaimer, the term of this patent is extended or adjusted under 35 U.S.C. 154(b) by 0 days.

(21) Appl. No.: 09/368,661

(22) Filed: Aug. 5, 1999

(51) Int. Cl.[7] .................................................... B01L 1/04
(52) U.S. Cl. ........................... 55/385.2; 55/482; 55/484; 95/288; 454/187
(58) Field of Search .................................. 55/385.2, 482, 55/484; 95/288; 454/187

(56) References Cited

U.S. PATENT DOCUMENTS

| | | | |
|---|---|---|---|
| 5,015,451 | * | 5/1991 | Holter et al. ........................ 423/235 |
| 5,122,170 | * | 6/1992 | Satoh et al. ........................... 55/316 |
| 5,169,418 | * | 12/1992 | Honda et al. ......................... 55/268 |
| 5,326,316 | * | 7/1994 | Hashimoto et al. ................. 454/187 |
| 5,626,820 | * | 5/1997 | Kinkead et al. ..................... 422/122 |
| 5,827,339 | * | 10/1998 | Nagafune et al. ................. 55/350.1 |
| 5,922,105 | * | 7/1999 | Fujii et al. .............................. 95/63 |
| 5,972,060 | * | 10/1999 | O'Halloran et al. ................ 55/385.2 |
| 5,997,398 | * | 12/1999 | Yamada et al. ..................... 454/187 |
| 6,102,977 | * | 8/2000 | Johnson .............................. 55/385.2 |

\* cited by examiner

Primary Examiner—Peter A. Hruskoci
(74) Attorney, Agent, or Firm—R. W. Becker & Associates; R. W. Becker

(57) ABSTRACT

A clean room is provided through which clean air/recirculated air flow, and which comprises at least one processing unit and/or processing surface to which is supplied a gaseous medium of known composition, wherein the gaseous medium can be supplied to the clean room separately.

21 Claims, 3 Drawing Sheets

CLEAN ROOM

BACKGROUND OF THE INVENTION

The present invention relates to a clean room through which clean air/recirculated air flow and in which at least one processing unit and/or at least one processing surface are disposed to which a gaseous medium is to be supplied.

It is known to treat wafers in a clean room with chemicals at processing units or processing surfaces. In this connection, gaseous substances are released that are carried along by the clean air that flows through the clean room. Since varying processing units and/or processing surfaces are found in the clean room for undertaking different treatments of the wafers, the clean air that flows in the recirculating air process contains very different gaseous constituents, which can lead to disruptions during the treatment of wafers at individual processing units and/or processing surfaces. It is known to remove such gaseous constituents from the recirculating air of the clean room with filter stages that operate in a chemically sorptive and/or adsorptive manner. However, the great number of chemicals emitted into the clean room from the various processes make it difficult and expensive to again remove all these materials to the required extent from the recirculated air. It is in addition frequently difficult to associate disruptions that occur at individual treatment steps to specific harmful substances in the recirculated air, thus making more difficult an optimum design of appropriate filter stages.

It is therefore an object of the present invention to improve a clean room of the aforementioned general type in such a way that a satisfactory treatment is ensured at the respective processing unit and/or processing surface.

BRIEF DESCRIPTION OF THE DRAWINGS

This object, and other objects and advantages of the present invention, will appear more clearly from the following specification in conjunction with the accompanying schematic drawings, in which.

SUMMARY OF THE INVENTION

The clean room of the present invention is characterized primarily in that the gaseous medium is supplied with a known composition to the processing unit and/or processing surface separately from the recirculated air.

With the inventive clean room, the gaseous medium, the chemical composition of which is known, is supplied to the region in which a sensitive process takes place, separately from the clean air/recirculated air. As a result, this gaseous medium can be optimally cleaned since the appropriate filter components can be easily coordinated to the constituents of the gaseous medium. The treatment of the gaseous medium is thereby limited to that quantity that is required for supplying the sensitive processing surfaces. By separating the gas stream for the sensitive processing surfaces from the recirculated air flow of the clean room, one is ensured that disruptions at various processing units and/or processing surfaces within the clean room region are reliably avoided. The gaseous medium is advantageously treated or processed prior to the supply to the processing unit and/or processing surface, for example being cooled, heated, moistened, dehydrated, or for example also filtered.

Further specific features of the present invention will be described in detail subsequently.

DESCRIPTION OF PREFERRED EMBODIMENTS

Figure 1:
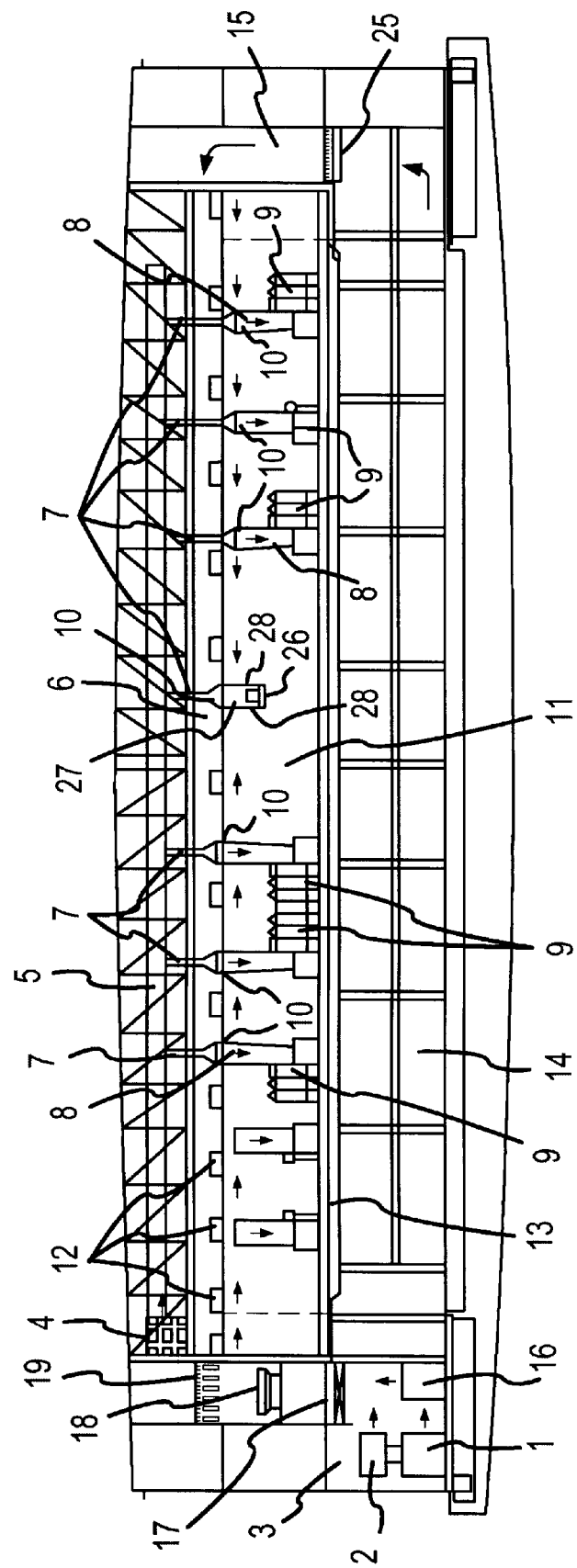
FIG. 1 is a cross-sectional view of a first exemplary embodiment of an inventive clean room.

Referring now to the drawings in detail, in the embodiment illustrated in FIG. 1 the atmospheric air is drawn in as gaseous medium by at least one outer air device 1, downstream of which is disposed an outer air collection channel 2. The air device 1 and collection channel 2 advantageously form a structural unit that is disposed in an equipment space or chamber 3. Disposed down stream of the outer air device 1 is at least one chemi-/adsorptive filter unit 4 in which the air is processed in a manner to be described subsequently. After the filter unit 4, the processed air passes into at least one passage 5 that is disposed in the region above a plenum 6. Communicating with the passage 5 are conduits 7 that project downwardly into the plenum 6 and open via at least one mechanical filter 10 (e.g. for chemical agents suspended in the air) into flow chambers 8, via which the processed air is conveyed to processing units 9 and/or processing surfaces. The processing units 9 and the processing surfaces are disposed in the clean room 11, through which flows clean air that flows downwardly out of filter-ventilator units 12 that are disposed in a known manner in the ceiling region of the clean room 11. Not only the clean air but also the processed or treated air that flows through the flow chambers 8 pass via a perforated floor 13 of the clean room 11 into a collection chamber 14 in which the clean air is mixed with the processed air and flow in the direction of the indicated arrows via an upwardly extending supply passage 15 into the plenum 6. This recirculated air is drawn-in in a known manner via the filter-ventilator units 12 and is filtered prior to entering the clean room 11. The supply passage 15 is separate from the passage 5.

The flow chambers 8 are provided in those regions where a process takes place that is sensitive to molecular contamination and/or to moisture or temperature conditions. Processed or treated outer air, the chemical composition of which is known, is supplied to these regions via the flow chambers 8. The chemical composition of the recirculated air corresponds at least to the chemical composition of the outer air introduced into the clean room. Outer air is an economical gas and is therefore preferred for supplying the processing units and/or the processing surfaces. The post treatment of the outer air is also more economical and easier than the post treatment of the recirculated air. In this way, the molecular impurities can be satisfactorily removed. It is to be understood that other gaseous media, for example pure nitrogen, can also be supplied via the flow chambers 8 to the processing units 9 and/or processing surfaces. The flow chambers 8 are formed by walls that separate the treatment chamber or processing surfaces from the clean air of the clean room 11. The processed air takes along the gasses or vapors that result at the processing units and/or the processing surfaces during the treatment of the wafers. Since the chemical composition of the drawn-in outer air is known, it can be optimally cleaned since the appropriate filter elements can be precisely coordinated to the components of the processed air. Since the processing surfaces are very small in relation to the clean room surfaces, only very small quantities of air are required in order to supply the sensitive regions 9 within the clean room 11 with the treated air. The flow chambers 8 are opened downwardly in a direction toward the treatment region or processing units 9 or processing surfaces, yet are embodied in such a way that processed air that flows downwardly in the flow chambers 8 does not come into contact with the clean air within the clean room 11. The optimum cleaning possibilities for the processed air ensures that the clean air that flows downwardly from above through the clean room 11 does not contain harmful constituents that could cause disruptions during the processing of the wafers. For this areas on, the wafers can be processed in very different manners in the clean room 11 at the various processing units 9 or processing surfaces.

A moisture providing or removal unit 16 can be disposed downstream of the outer air device 1 for providing various air conditions for individual zones or processing units. This unit 16 is advantageously also accommodated in the equipment chamber 3. The moisture providing or removal unit 16 can be embodied as a condenser or can be provided with sorption elements, such as lithium chloride, silica gel, zeolite, and the like. Moisture can be provided in a known manner, for example via humidifiers of the ultrasonic, spray, trickle, or vapor type. The moisture providing or removal unit 16 can also be part of the outer air device 1.

A heat exchanger 17 (cooler/heater) can also be disposed downstream of the outer air device for the precise temperature regulation of special zones or processing units 9. The heat exchanger 17 can also be provided together with the moisture providing or removal unit 16 in the equipment chamber 3.

To overcome the pressure losses resulting from the heat exchanger and/or the filter stages 4, at least one blower 18 can be provided that in the direction of flow of the process air is disposed after the heat exchanger 17 and/or the moisture or removal unit 16. Following the blower 18, a muffling means 19 can be provided that is formed of plates that are disposed parallel to one another and that extend in the direction of flow of the processed air.

In the illustrated embodiment, the filter unit 4 is disposed at the entrance into the channel 5. Depending upon the position and arrangement of the processing units 9 or the processing surfaces, a plurality of passages 5 can be provided via which the treated or processed air is supplied in the described manner to the appropriate processing units 9 and processing surfaces. In each case, prior to entering the various passages 5 the air flows through the filter unit 4. Such a filter unit 4 can be provided ahead of each passage 5. However, it is also possible to provide only a single filter unit 4 through which the process air is conveyed before it passes to the individual passages 5.

Figure 2:
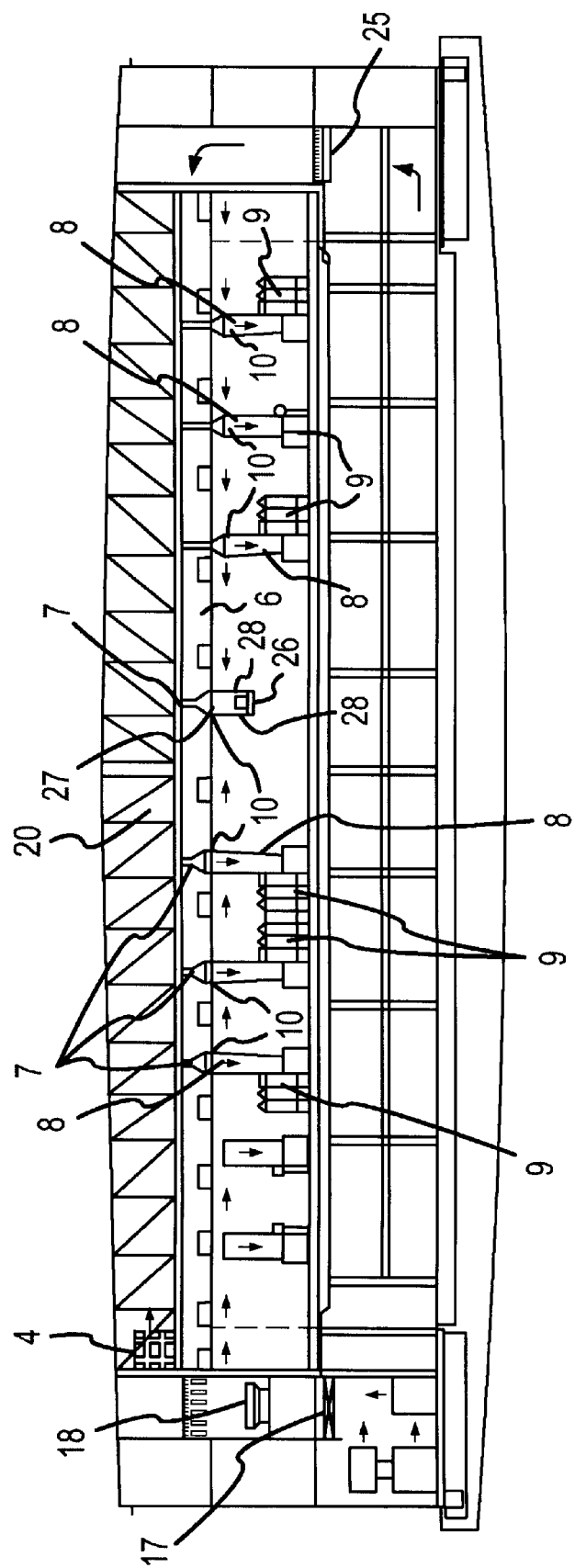
FIG. 2 is a cross-sectional view of a second exemplary embodiment of an inventive clean room.

The embodiment illustrated in FIG. 2 differs from the previous embodiment merely in that instead of one or more tubular passages 5, at least one chute 20 or a pressure plenum is provided in which the processed air flows. Just like the passage 5, the chute 20 is also completely separate from the plenum 6. From the chute 20 the conduits 7 proceed via which the processed or treated air is supplied in the described manner to the processing units and/or the processing surfaces via at least one mechanical filter 10. The conduits 7 open into the downwardly leading flow chambers 8 in which the processed air is supplied directly to the processing units 9 and/or the processing surfaces. In other respects, this clean room operates in the same manner as described in conjunction with the embodiment of FIG. 1.

Figure 3:
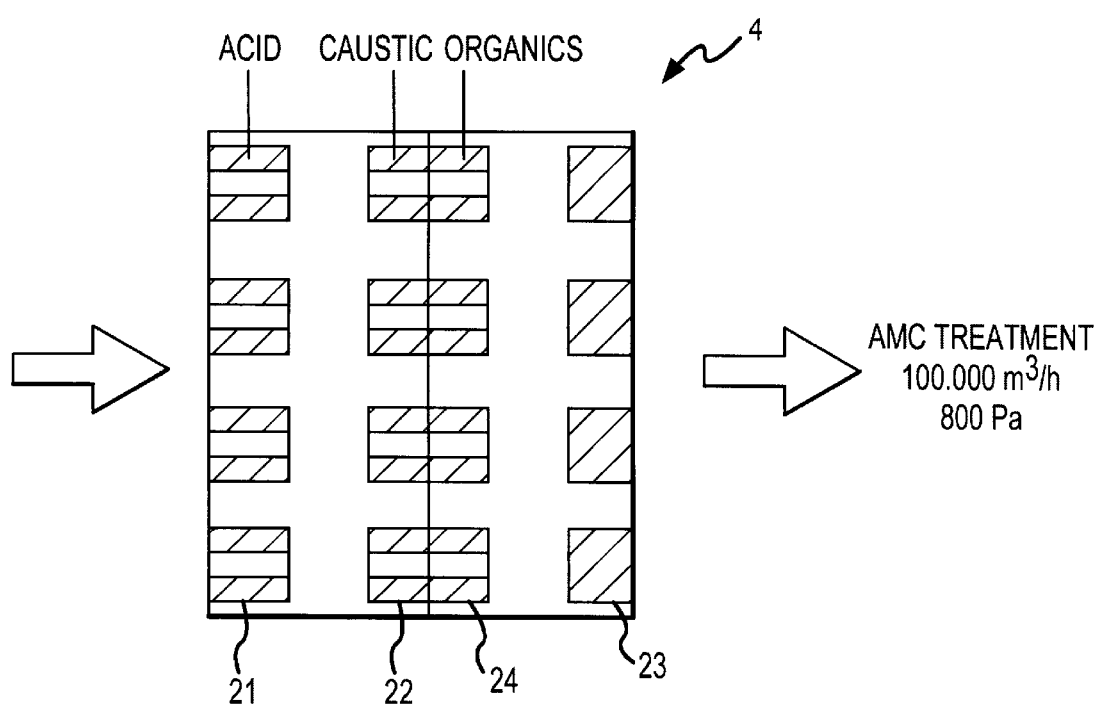
FIG. 3 shows an exemplary embodiment of a filter unit of the inventive clean room.

FIG. 3 shows the basic construction of the filter unit 4. It has at least one filter stage. In the illustrated embodiment, four filter stages 21 to 24 are provided. With these filter stages, the differing constituents of the supplied gaseous medium, in particular the outer air, can be filtered before the medium is conveyed in the described manner via the conduits 7 and the flow chambers 8 to the processing units 9 and/or processing surfaces. In the filter stage 21, basic constituents of the gaseous medium are absorbed or otherwise restrained. In conformity therewith, this filter stage 21 comprises acidic components.

In the filter stage 22, acidic constituents of the gaseous medium are absorbed or otherwise restrained. The filter stage 22 therefore comprises basic filter components.

The filter stage 23 is formed by a high efficiency filter (HEPA filter) for restraining particles that are present in the gaseous medium.

The filter unit 4 can also have the filter stage 24 which is formed of organic filter components for restraining organic constituents of the gaseous medium.

As the gaseous medium that comes from the outer air unit 1 passes through the filter unit 4, the acidic, basic and organic constituents, as well as dirt particles, are restrained, so that the processed or treated gaseous medium that is supplied to the processing units 9 and/or processing surfaces no longer contains damaging constituents. Since the composition of the supplied gaseous medium is known, the filter unit 4 can be optimally embodied in such a way that all constituents contained in the supplied gaseous medium are satisfactorily filtered.

The sequence of the described filter stages 21 to 24 in the filter unit 4 can vary. And, depending upon the composition of the supplied gaseous medium, one or more of the filter stages can also be eliminated. The preferred gaseous medium is outer air that is economically available in large quantities. The filter unit can, for example, be embodied in such a way that a throughput of 100,000 m$^3$/h is possible.

The processed or treated gaseous medium takes up the gaseous constituents and particles that result at the processing unit and/or processing surface during treatment. A portion of the gaseous medium is supplied out of the processing unit 9 and/or out of the processing surface to a non-illustrated exhaust air system that therewith removes a large portion of the constituents emitted from the processes. The other portion of the gaseous medium passes downwardly through the base or floor 13 into the collection chamber 14. At this location, the gaseous medium is mixed with the clean air that flows from above downwardly through the remaining region of the clean room 11. The filter-ventilator units 12 satisfactorily filter out the particulate matter that has been taken up.

At least one heat exchanger 25 (FIGS. 1 and 2) is advantageously disposed at the transition from the horizontal collection chamber 14 to the vertical supply passage 15 in order to enable a precise temperature regulation of the clean air that is supplied to the filter-ventilator units 12.

If a plurality of horizontal passages 5 or chutes 20 that are disposed next to one another are provided for the supply of the processed gaseous medium, the blower 18 is particularly advantageous. It overcomes not only additional pressure losses through the heat exchanger 17 and the filter unit 4, but is also of advantage if the outer air device 1 supplies a plurality of parallel passages 5 or chutes 20 and for example only the outer air from one passage 5 or one chute 20 is conveyed via additional chemi-adsorptive filter stages.

The filter-ventilator units 12 disposed in the plenum 6 are separate from the passage 5 or chute 20 so that a reciprocal influencing of the clean air and the processed gaseous medium is precluded.

As shown for example in FIGS. 1 and 2, a transporting means 26 for the wafers is provided at the ceiling of the clean room 11 in order to transport the wafers within the clean room. The transporting means 26 is disposed in a flow chamber 27 that is downwardly open into the clean room 11 and on the sides is delimited by walls 28. The flow chamber 27 communicates via at least one conduit 7 and at least one mechanical filter 10 with the passage or chute 20. Thus, processed gaseous medium also flows through the flow chamber 27.

The processed gaseous medium is advantageously provided in such regions of the clean room 11 in which the wafers are temporarily stored for longer periods of time.

The specification incorporates by reference the disclosure of German priority document 198 35 538.6 of Aug. 6, 1999.

The present invention is, of course, in no way restricted to the specific disclosure of the specification and drawings, but also encompasses any modifications within the scope of the appended claims.

What I claim is:

1. A clean room through which clean air/recirculated air flow, comprising at least one processing unit and/or processing surface to which is supplied a gaseous medium of known composition and a flow chamber, wherein said gaseous medium is supplied to said clean room separately from said recirculated air and wherein said flow chamber directly provides said gaseous medium to said at least one processing unit and/or processing surface, wherein said flow chamber is formed by walls that separate the processing unit an/or processing surface from the clean air/recirculated air flow in the clean room in such a way that the gaseous medium does not come in contact with clean air within the clean room.

2. A clean room according to claim 1, wherein at least one intake unit is provided for supply of gaseous medium to said flow chamber.

3. A clean room according to claim 2, wherein a collection channel follows said intake unit.

4. A clean room according to claim 2, wherein at least one moisture providing or removal unit is disposed downstream of said intake unit.

5. A clean room according to claim 2, wherein said intake unit includes a moisture providing or removal unit.

6. A clean room according to claim 2, wherein at least one heat exchanger is disposed downstream of said intake unit.

7. A clean room according to claim 6, wherein a moisture providing or removal unit is disposed between said intake unit and said at least one heat exchanger.

8. A clean room according to claim 1, wherein at least one filter unit is provided for said gaseous medium and is disposed upstream of said flow chamber.

9. A clean room according to claim 8, wherein said filter unit comprises a plurality of filter stages.

10. A clean room according to claim 9, wherein said filter unit is provided with at least one filter stage having acidic filter components for catching basic constituents in said gaseous medium.

11. A clean room according to claim 9, wherein said filter unit includes at least one filter stage having basic filter components for catching acidic constituents of said gaseous medium.

12. A clean room according to claim 9, wherein said filter unit includes at least one filter stage having organic filter components for catching organic constituents of said gaseous medium.

13. A clean room according to claim 9, wherein said filter unit includes at least one filter stage for restraining particles of said gaseous medium.

14. A clean room according to claim 1, which includes at least one passage, chute, or pressure plenum to which said gaseous medium can be supplied and which is separate from the clean room itself, wherein at least one conduit is provided that leads from said passage, chute, or pressure plenum to said clean room.

15. A clean room according to claim 14, wherein said conduit opens into said flow chamber.

16. A clean room according to claim 15, wherein said flow chamber leads to said processing unit and/or processing surface.

17. A clean room according to claim 1, wherein said gaseous medium and said clean air flow into at least one collection chamber that is in flow communication with a plenum.

18. A clean room according to claim 1, wherein a transporting means is provided for objects that are to be treated, and wherein said transporting means is disposed in a path of said gaseous medium.

19. A clean room according to claim 18, wherein said transporting means is disposed in a flow chamber that is open in a direction towards said clean room.

20. A clean room according to claim 19, wherein the open flow chamber is in flow communication with a passage, chute or pressure plenum that is separate from and upstream of said clean room itself.

21. A clean room according to claim 1, wherein said gaseous medium is atmospheric air.

* * * * *